(12) United States Patent
An

(10) Patent No.: US 9,112,129 B2
(45) Date of Patent: Aug. 18, 2015

(54) LIGHT EMITTING DIODE PACKAGE AND LIGHT UNIT HAVING THE SAME

(75) Inventor: Joong In An, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 149 days.

(21) Appl. No.: 13/006,687

(22) Filed: Jan. 14, 2011

(65) Prior Publication Data

US 2011/0198658 A1   Aug. 18, 2011

(30) Foreign Application Priority Data

Jan. 18, 2010   (KR) .................. 10-2010-0004410

(51) Int. Cl.
*H01L 33/00* (2010.01)
*H01L 33/64* (2010.01)
*H01L 33/62* (2010.01)

(52) U.S. Cl.
CPC .............. *H01L 33/647* (2013.01); *H01L 33/62* (2013.01); *H01L 2224/48091* (2013.01); *H01L 2224/48247* (2013.01)

(58) Field of Classification Search
USPC ..................... 257/79–103, E33.066
See application file for complete search history.

(56) References Cited

U.S. PATENT DOCUMENTS

| 6,376,902 | B1 | 4/2002 | Arndt | 257/678 |
|---|---|---|---|---|
| 7,626,211 | B2 | 12/2009 | Sugiura et al. | 257/99 |
| 7,709,857 | B2 | 5/2010 | Kim et al. | 257/100 |
| 2007/0063209 | A1* | 3/2007 | Sugiura et al. | 257/98 |
| 2007/0108436 | A1 | 5/2007 | Sanmyo | 257/13 |
| 2008/0128738 | A1 | 6/2008 | Su | 257/99 |
| 2008/0165543 | A1 | 7/2008 | Lin et al. | 362/362 |
| 2008/0296592 | A1* | 12/2008 | Osamu | 257/89 |
| 2008/0298081 | A1 | 12/2008 | Oon et al. | 362/555 |
| 2009/0179219 | A1 | 7/2009 | Kim et al. | 257/99 |
| 2009/0242915 | A1* | 10/2009 | Chang Chien et al. | 257/98 |
| 2009/0315068 | A1 | 12/2009 | Oshio et al. | 257/103 |
| 2010/0001308 | A1 | 1/2010 | Park et al. | 257/99 |

FOREIGN PATENT DOCUMENTS

| CN | 1898809 A | 1/2007 |
|---|---|---|
| JP | 2007-295706 A | 11/2007 |
| JP | 2008-172187 A | 7/2008 |
| JP | 2008-218763 A | 9/2008 |
| JP | 2009-295948 A | 12/2009 |
| KR | 10-2009-0022350 A | 3/2009 |
| KR | 10-2010-0003000 A | 1/2010 |
| WO | WO 2009/038069 A1 | 3/2009 |

OTHER PUBLICATIONS

Chinese Office Action dated Nov. 2, 2012 issued in Application No. 201110022130.1 (with English translation).
European Search Report dated Jun. 23, 2014 issued in foreign application No. 11151309.9.
Japanese Office Action issued in Application No. 2011-007107 dated Oct. 28, 2014.

* cited by examiner

*Primary Examiner* — Ori Nadav
(74) *Attorney, Agent, or Firm* — KED & Associates LLP

(57) ABSTRACT

Disclosed are a light emitting device package and a light unit having the same. The light emitting device package includes a body including a cavity at a first side surface, first and second lead frames in the cavity, a light emitting device connected to the first and second lead frames, a heat radiation pad on a second side surface of the body, a heat radiation frame on a third side surface of the body, and first and second electrode pads disposed on the second side surface of the body and spaced apart from the heat radiation pad.

20 Claims, 8 Drawing Sheets

LIGHT EMITTING DIODE PACKAGE AND LIGHT UNIT HAVING THE SAME

The present application claims priority of Korean Patent Application No. 10-2010-0004410 filed on Jan. 18, 2010, which is hereby incorporated by reference in its entirety.

BACKGROUND

The embodiment relates to a light emitting diode package and a light unit having the same.

A light emitting diode (LED) may constitute a light emitting source by using GaAs, AlGaAs, GaN, InGaN, and InGaAlP-based compound semiconductor materials.

Such an LED is packaged so as to be used as a light emitting device that emits lights having various colors. The light emitting device is used as a light source in various products such as a lighting indicator, a character indicator, and an image indicator.

SUMMARY

The embodiment provides a light emitting diode package having a new heat radiant heating structure and a light unit having the same.

The embodiment provides a light emitting diode package having a body disposed at both sides thereof with heat sink plates and a light unit having the same.

According to the embodiment, a light emitting device package includes a body including a cavity at a first side surface, first and second lead frames in the cavity, a light emitting device connected to the first and second lead frames, a heat radiation pad disposed on a second side surface of the body, a heat radiation frame disposed on a third side surface of the body, and first and second electrode pads disposed on the second side surface of the body and spaced apart from the heat radiation pad.

According to the embodiment, a light emitting device package includes a body including a cavity, first and second lead frames in the cavity, a light emitting device disposed on the first lead frame, a heat radiation pad extending from the first lead frame and wherein the heat radiation pad is disposed on a lower surface of the body, a heat radiation frame in contact with a top surface of the body, a first electrode pad disposed on the lower surface of the body, wherein the first electrode pad is spaced apart from the heat radiation pad, and wherein the first electrode pad extends from the first lead frame, a second electrode pad disposed on the lower surface of the body, wherein the second electrode pad is spaced apart from the heat radiation pad, and wherein the second electrode pad extends from the second lead frame, and a resin member in the cavity.

According to the embodiment, a light unit includes a board including first to third patterns, and a plurality of light emitting device packages on the board, wherein each light emitting device package includes a body including a cavity at a front surface, first and second lead frames in the cavity, a light emitting device connected to the first and second lead frames, a heat radiation pad disposed on a lower surface of the body and connected to the second pattern of the board, a heat radiation frame on a top surface of the body, and first and second electrode pads disposed on the lower surface of the body and connected to the first and third patterns of the board.

DETAILED DESCRIPTION OF THE EMBODIMENTS

Figure 1:
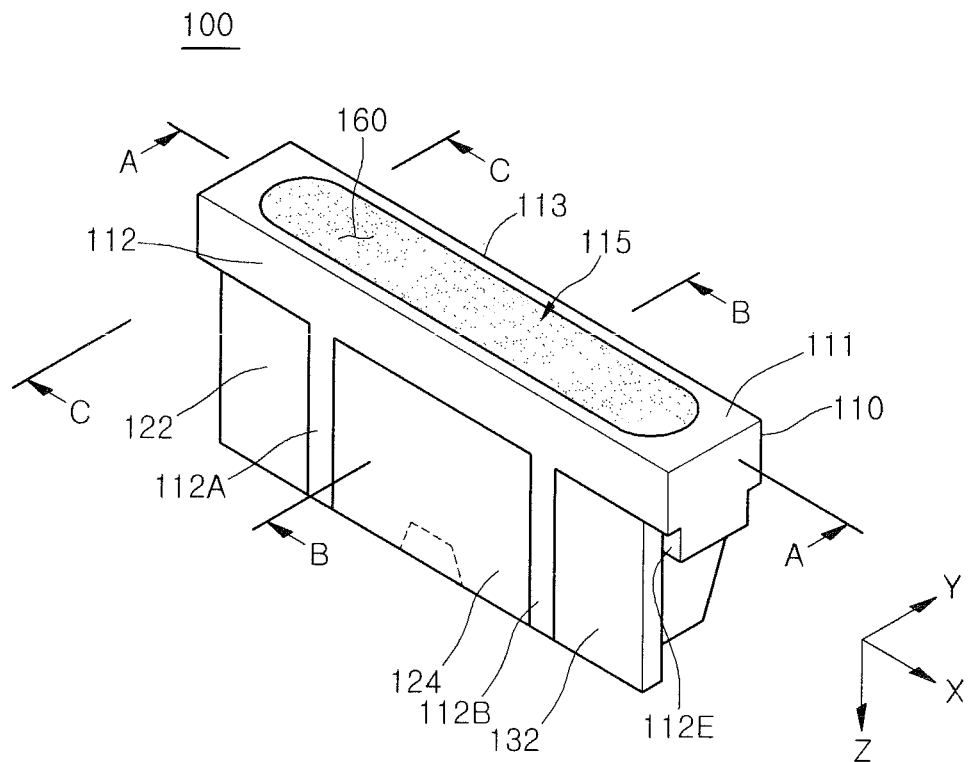
FIG. 1 is a perspective view showing a light emitting device package according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Figure 2:
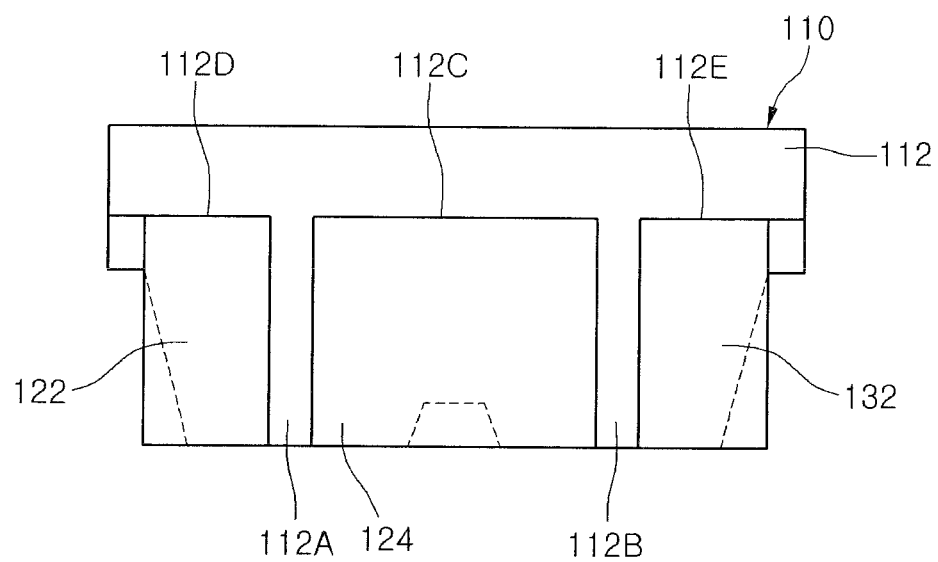
FIG. 2 is a bottom view of FIG. 1.
Figure 3:
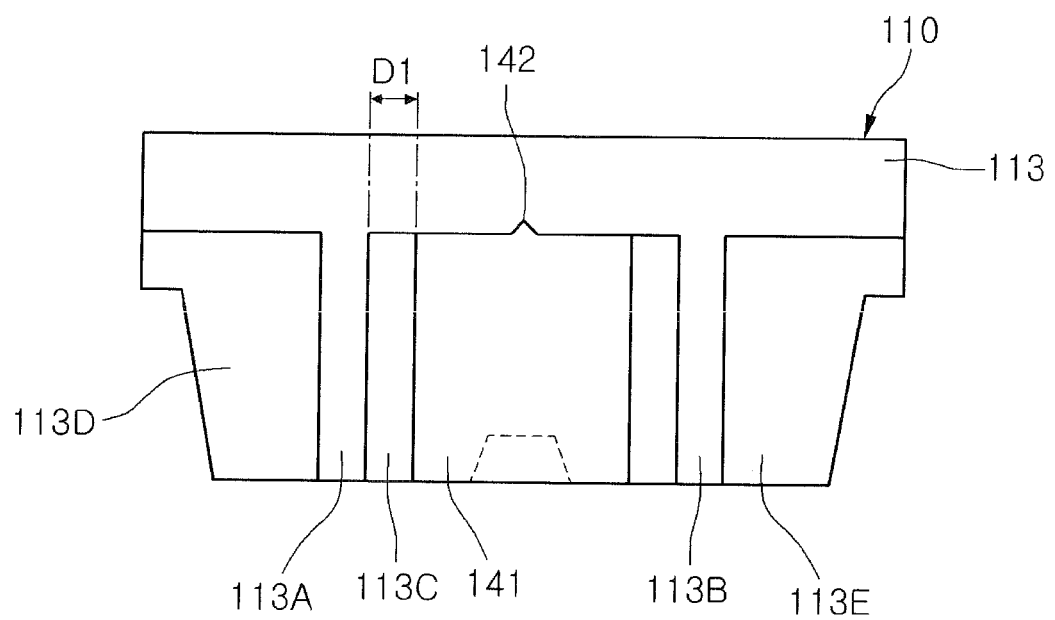
FIG. 3 is a plan view of FIG. 1.
Figure 4:
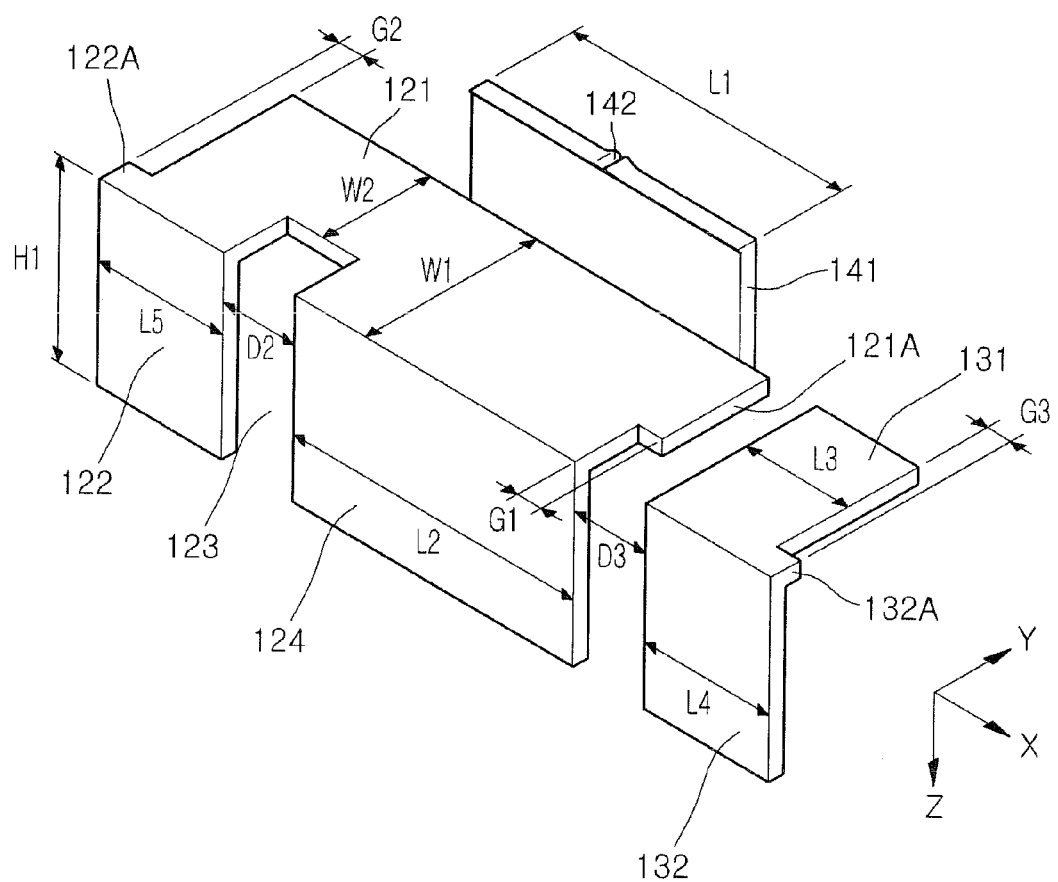
FIG. 4 is a view showing a frame structure of FIG. 1.
Figure 5:
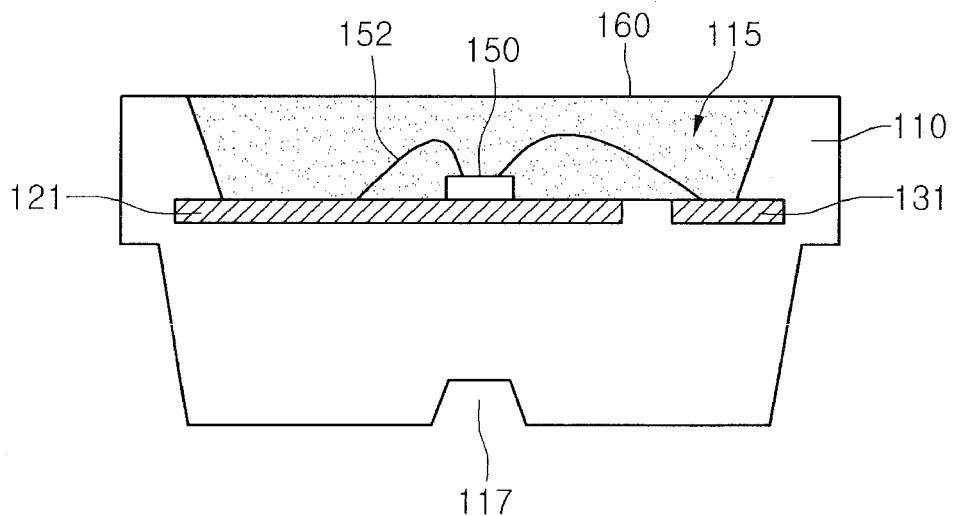
FIG. 5 is a sectional view taken along line A-A of FIG. 1.
Figure 6:
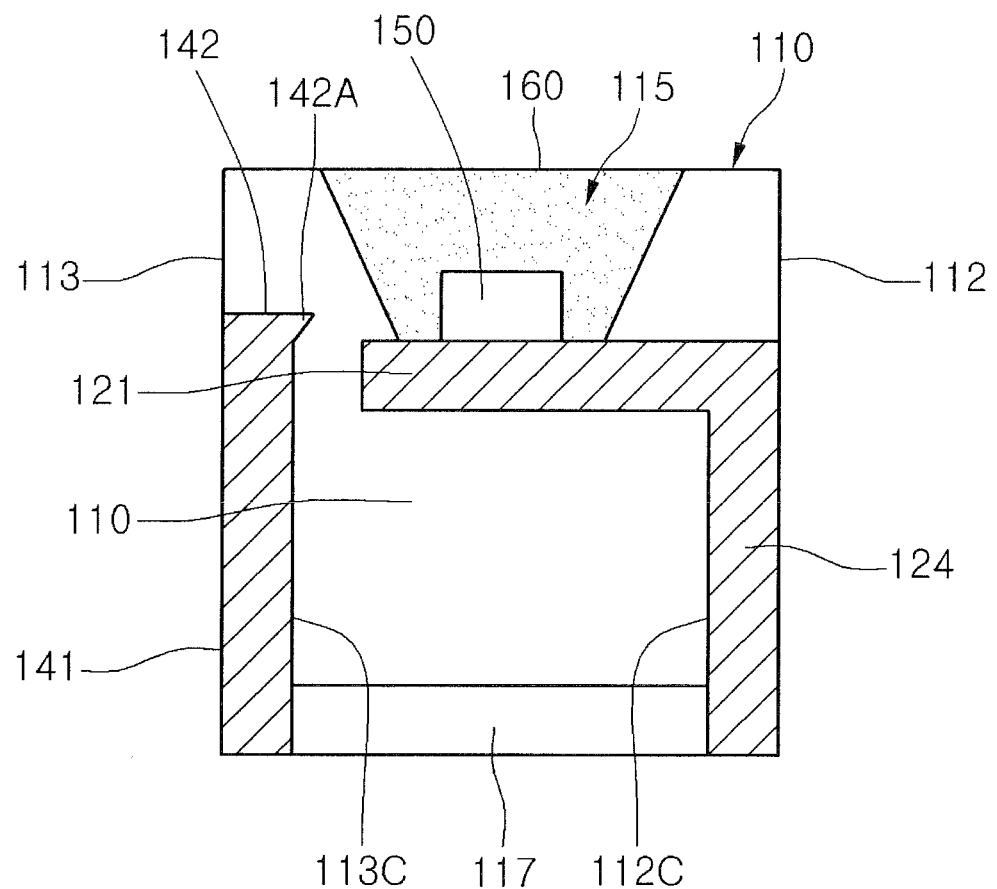
FIG. 6 is a sectional view taken along line B-B of FIG. 1.
Figure 7:
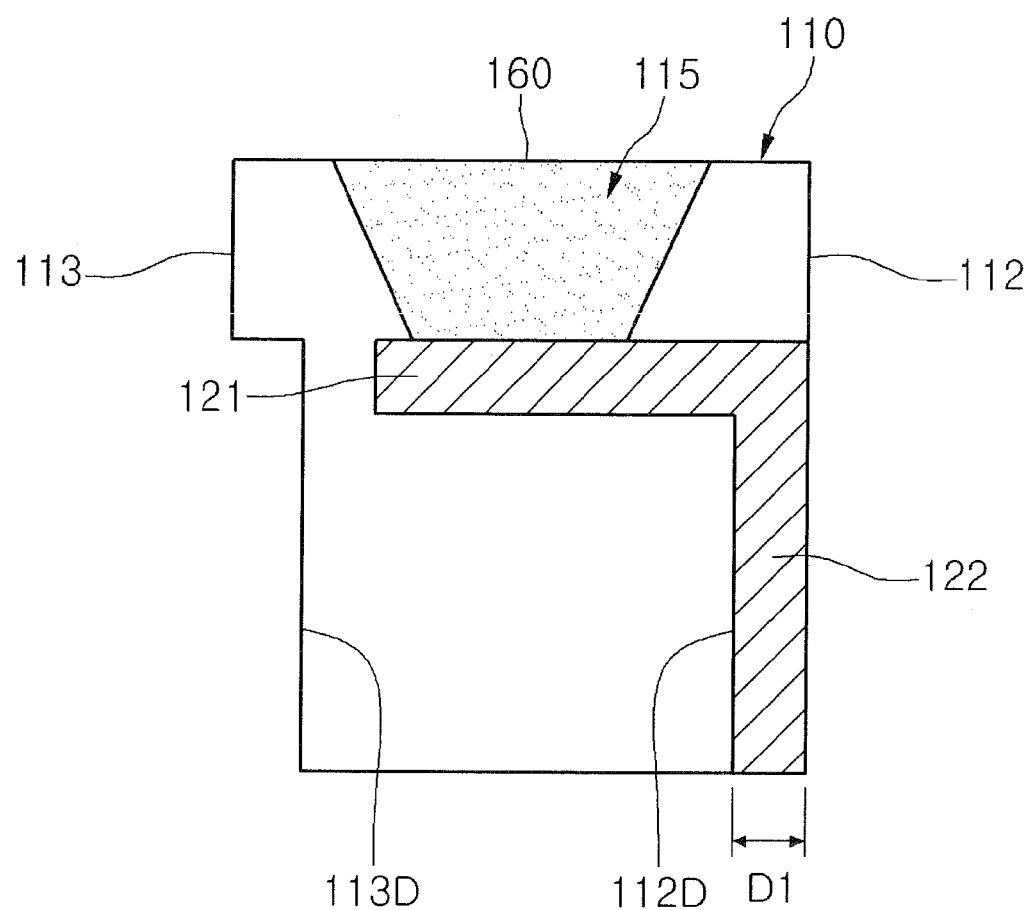
FIG. 7 is a sectional view taken along line C-C of FIG. 1.

FIG. 1 is a perspective view showing a light emitting device package according to a first embodiment, FIG. 2 is a bottom view of FIG. 1, and FIG. 3 is a plan view of FIG. 1. FIG. 4 is a view showing a frame structure of FIG. 1, FIG. 5 is a sectional view taken along line A-A of FIG. 1, and FIG. 6 is a sectional view taken along line B-B of FIG. 1. FIG. 7 is a sectional view taken along line C-C of FIG. 1.

Referring to FIGS. 1 to 7, a light emitting device package 100 includes a body 110 having a cavity 115, a first lead frame 121, a second lead frame 131, a heat radiation pad 124, a first electrode pad 122, a second electrode pad 132, a heat radiation frame 141, a light emitting device 150, and a resin member 160.

For example, the body 110 may include one selected from the group consisting of resin material such as polyamides (Nylon), PPA (polypthalamide), polycarbonate, phenylene oxide-based resin, thermoplastic polyester, PPS (polyphenylene sulfide), or polymer alloy, a silicon material, a ceramic substrate, an insulating substrate, and a metallic substrate (e.g., MCPCB). Hereinafter, an example in which the body 110 includes an insulating material will be described.

A plurality of lead frames 121 and 123 are disposed in the body 110. When performing injection molding for the body 110, the lead frames may be disposed in the body 110 and hardened. Referring to FIGS. 5 and 6, a recess 117 of the body 110 is formed by a gate of the injection molding for the body 110.

The lead frames may be defined as the first and second lead frames 121 and 131.

The body 110 includes a first side surface 111 having a region of outputting light, a second side surface 112 on which the first and second electrode pads 122 and 132 are disposed, and a third side surface 113 opposite to the second lateral surface 112. The first side surface 111 may be disposed between the second and third side surfaces 112 and 113 and perpendicular to the second side surface 112. The first, second, and third side surfaces 111, 112, and 113 of the body 110 may serve as a front surface, a lower surface, and a top surface, respectively, and the details of side surfaces other than the opposition surface of the first side surface 111 and the second and third side surfaces 112 and 113 will be omitted.

The cavity 115 is disposed in the first side surface 111 of the body 110. The cavity 115 is formed by recessing a center region of the first side surface 111 in an opposition direction of the first side surface 111. In other words, the cavity 115 includes the first side surface 111 having an open center region.

The cavity 115 serves as a region through which light is output. The light emitting device is mounted on the second side surface 112 of the body 110. The third side surface 113 of the body 110 serves as an opposition surface of the second side surface 112 and may be exposed.

The open region of the cavity 115 may have a polygonal shape or at least both sides of the open region may have a hemispherical shape.

Referring to FIGS. 1 and 2, a plurality of separation portions are disposed on the second side surface 112 of the body 110. The separation portions extend in the direction (Z axial direction) of the second side surface 112 from the first side surface 111 while being spaced apart from each other. The separation portions may be disposed in parallel to each other.

The separation portions include first and second separation portions 112A and 112B. The first separation portion 112A is disposed between the heat radiation pad 124 and the first electrode pad 122. The second separation portion 112B is disposed between the heat radiation pad 124 and the second electrode pad 132.

Recess portions 112C, 112D, and 112E having a step difference from the first and second separation portions 112A and 112B are formed on the second side surface 112 of the body 110. The heat radiation pad 124, the first electrode pad 122, and the second electrode pad 132 are received in the recess portions 112C, 112D, and 112E. A bottom surface of the recess portions 112C, 112D, and 112E may be closer to the third side surface 113 than to a top surface of the separation portions 112A and 112B.

The first separation portion 112A, the heat radiation pad 124, and the second separation portion 112B are arranged substantially on the same plane. The heat radiation pad 124, the first electrode pad 122, and the second electrode pad 132 may have the same size or different sizes.

The first electrode pad 122 is disposed at one side of the first separation portion 112A, and the second electrode pad 132 is disposed at an opposite side of the second separation portion 112B. The heat radiation pad 124 is disposed between the first and second separation portions 112A and 112B.

The first separation portion 112A blocks the heat radiation pad 124 from making contact with the first electrode pad 122, and the second separation portion 112B blocks the heat radiation pad 124 from making contact with the second electrode pad 132. The first and second separation portions 112A and 112B may have a predetermined width such that the interval between the heat radiation pad 124 and the first electrode pad 122 and the interval between the heat radiation pad 124 and the second electrode pad 132 can be constantly maintained.

The heat radiation pad 124 has an area greater than 40% of the area of the second side surface 112 of the body 110. The heat radiation pad 124 may have an area at least two times greater than the area of the first electrode pad 122 or the second electrode pad 132. The heat radiation pad 124 may have a width at least two times great than that of the first electrode pad 122.

Referring to FIG. 3, the third side surface 113 of the body 111 may have a shape symmetrical to that of the second side surface 112. For example, third and fourth separation portions 113A and 113B are disposed at both sides of the third side surface 113, and recess portions 113C, 113D, and 113E are formed at first and second sides of the third separation portion 113A and the fourth separation portion 113B. The heat radiation frame 141 is disposed at the recess portion 113C between the third and fourth separation portions 113A and 113B, and may has a width narrower than that of the recess portion 113C.

The heat radiation frame 141 may have an area smaller than that of the heat radiation pad 124. For example, the heat radiation frame 141 less than 40% of the area of the third side surface 113 of the body 110.

Referring to FIGS. 4 to 6, the first and second lead frames 121 and 131 are disposed in the cavity 115. The first and second lead frames 121 and 131 are electrically separated from each other in the cavity 115 and disposed on a bottom surface of the cavity 115.

The first lead frame 121 includes the heat radiation pad 124 and the first electrode pad 122. The heat radiation pad 124 and the first electrode pad 122 extend from the first lead frame 121 in the direction of the second side surface 112 and are bent downward. Since the heat radiation pad 124 is not affected by the first electrode pad 122, heat radiation may be effectively performed. The second lead frame 131 includes the second electrode pad 132, and the second electrode pad 132 extends from the second lead frame 131 in the direction of the second side surface 112 is bent downward.

Referring to FIGS. 2 and 4, the heat radiation pad 124 extends from one side of the first lead frame 121 in the direction of the second side surface 112 of the body 110 and is bent downward, so the heat radiation pad 124 is disposed at the recess portion 112C formed on the second side surface 112 of the body 110.

The first electrode pad 122 extends from an opposite side of the first lead frame 121 in the direction of the second side surface 112 of the body 110 and is bent downward, so that the first electrode pad 122 is disposed at the recess portion 112D formed on the second side surface 112 of the body 110. As shown in FIG. 7, the depth D1 of the recess portion 112D may be about the thickness of each pad.

The second electrode pad 132 extends from the second lead frame 131 in the direction of the second side surface 112 of the body 110 and is bent downward, so that the second electrode pad 132 is disposed at the recess portion 112E disposed on the second side surface 112 of the body 110.

Referring to FIG. 4, the heat radiation frame 141 is opposite to the heat radiation pad 124 of the first lead frame 121, physically separated from the first and second lead frames 121 and 131 so that the heat radiation frame 141 is not electrically connected to the first and second lead frames 121 and 131.

A light emitting device is mounted on the first lead frame 121, and the first lead frame 121 has a length at least two times longer than that of the second lead frame 131.

The heat radiation pad 124 and the first electrode pad 122 protrude from the first lead frame 121 while being spaced apart from each other by a predetermined interval D2, thereby preventing the bonding strength with the body 110 from being weakened.

The top surface of the first lead frame 121 may have a first width W1 at a entire region, and have a second width W2 narrower than the first width W1 at a region between the first electrode pad 122 and the heat radiation pad 124. The second width W2 may be at least wider than the width of the bottom surface of the cavity.

A second end 122A of the first electrode pad 122 protrudes outward (Z axis direction) from a second end of the first lead frame 121 by a predetermined gap G2, so that a bonding area and a radiation area may be further increased. In other words, an opposite side surface of the first electrode pad 122 may have a step structure protruding from an opposite side surface of the first lead frame 121.

A first end 132A of the second electrode pad 132 protrudes outward (Z axis direction) from a first end of the second lead frame 131 by a predetermined gap G3. In other words, one side surface of the second electrode pad 132 forms a step structure with one side surface of the second lead frame 131. Therefore, a length L3 of the second lead frame 131 may be smaller than that of the second electrode pad 132. The bonding area and the heat radiation area of the second electrode pad 132 may be more increased due to the step structure.

The heat radiation pad 124 may be cut by a predetermined gap G1 from a first end 121A of the first lead frame 121 in an opposition direction of the second electrode pad 132. In other words, a first side surface of the heat radiation pad 124 may have a step structure with respect to a first side surface of the first lead frame 121.

A length L5 of the first electrode pad 122 may be identical to or different from a length L4 of the second electrode pad 132. The heights H1 of the first electrode pad 122, the heat radiation pad 124, and the second electrode pad 132 may have approximately identical to each other.

The distance D3 between the heat radiation pad 124 and the second electrode pad 132 may be narrowed than the distance between the first and second lead frames 121 and 131 due to the gap G1. Accordingly, the short can be prevented between the heat radiation pad 124 and the second electrode pad 132 in soldering. The heat radiation pad 124 receives heat from the first lead frame 121 and dissipates heat.

The length L1 of the heat radiation frame 141 is identical to or shorter than the length L2 of the heat radiation pad 124. The heat radiation frame 141 makes contact with the third side surface 113 of the body 110 to dissipate heat emitted from the body 110. At least one protrusion portion 142 may be disposed at the central portion of an upper end of the heat radiation frame 141, and may be inserted into the body 110. The heat radiation frame 141 is fixed to the body 110 by using the protrusion portion 142, and the movement of the heat radiation frame 141 can be prevented by the recess portion 113C of the body 110.

The first electrode pad 122, the heat radiation pad 124, and the second electrode pad 132 are arranged in line shape with each other, and the heat radiation pad 124 may be parallel to the heat radiation frame 141 in opposition to the heat radiation frame 141.

Referring to FIGS. 5 and 6, the body 110 is disposed between the heat radiation pad 124 and the first lead frame 121. The heat radiation pad 124 dissipates heat transferred to the lower portion of the body 110, for example, the second side surface. A light emitting device 150 is disposed in the cavity 115, and electrically connected to the first and second lead frames 121 and 131.

The light emitting device 150 may be disposed on the first lead frame 121 and may be connected to the first and second lead frames 121 and 131 by using a wire 152. The light emitting device 150 is disposed on the first lead frame 121 having the heat radiation pad 124. The heat radiation pad 124 and the heat radiation frame 141 are closer to the light emitting device 150 than to the first and second electrode pads 122 and 132.

The light emitting device 150, the heat radiation pad 124, and the heat radiation frame 141 may be arranged in line shape with each other as shown in FIG. 6.

The light emitting device 150 includes an LED chip. For example, the light emitting device 150 may include an LED chip, such as a blue, green, or red LED chip in a visible ray band or an LED chip in a UV band. The light emitting device 150 includes one of a P-N junction structure, N-P junction structure, P-N-P junction structure, N-P-N junction structure, and has a nitride-based semiconductor layer. The light emitting device 150 may be bonded to the first and second lead frames 121 and 131 through a flip-bonding scheme, or may be bonded to the first lead frame 121 through a die-bonding scheme. The bonding schemes may vary according to the type of a chip or the position of an electrode of the chip. The light emitting device package 100 may include a protective device connected to the first and second lead frames 121 and 131.

A resin member 160 is disposed in the cavity 115. The resin member 160 is filled in the cavity 115 to protect the light emitting device 150. The resin member 160 may include a luminescence material, and the luminescence material includes at least one of a green, yellow, or red luminescence material, but the embodiment is not limited thereto. The luminescence material may include at least one selected from the group consisting of YAG, TAG, silicate, nitride, oxynitride-based materials, but the embodiment is not limited thereto. The resin member 160 may have a single layer structure or a multiple layer structure. If the resin member 160 includes a multiple layer structure, the resin member 160 may have a stack structure of resin layers having refractive indexes gradually lowered. A lens may be formed on the resin member 160. The lens may have a convex shape and/or concave shape, but the embodiment is not limited thereto.

According to the first embodiment, in the light emitting device package, the heat radiation pad 124 connected to the first lead frame 121 is disposed on the second side surface of the body 110, and the heat radiation frame 141 having no connection with the first lead frame 121 is disposed on the third side surface disposed in opposition to the second side surface of the body 110, so that heat generated from the light emitting device 150 can be dissipated by the heat radiation frame 141 connected to the body 110 and the heat radiation pad 124 through the first lead frame 121. Accordingly, the heat radiation efficiency of the light emitting device package 110 can be improved, so that the reliability of the light emitting device 150 can be improved.

FIG. 7 is a side sectional view taken along line C-C of FIG. 1. Referring to FIGS. 1 and 7, the recess portion 113D is disposed corresponding to the first electrode pad 122 of the first lead frame 121, so that the thickness in a lower portion of the body 110 may be thinner than the thickness of the first side surface. Accordingly, the heat radiation efficiency through the recess portion 113D of the third side surface 113 of the body 110 can be increased. The details of the second electrode pad and the recess portion in opposition to the second electrode pad have been described in the above structure.

Meanwhile, although a structure in which the first and second electrode pads 122 and 132 are directly drawn to the first side surface of the body 110 in the cavity 115 has been described, the first and second electrode pads 122 and 132 may be drawn through another side surface (left/right side surface) and bent toward the second side surface of the body 110. Such structure modification may be changed within the technical scope of the embodiment.

Figure 8:
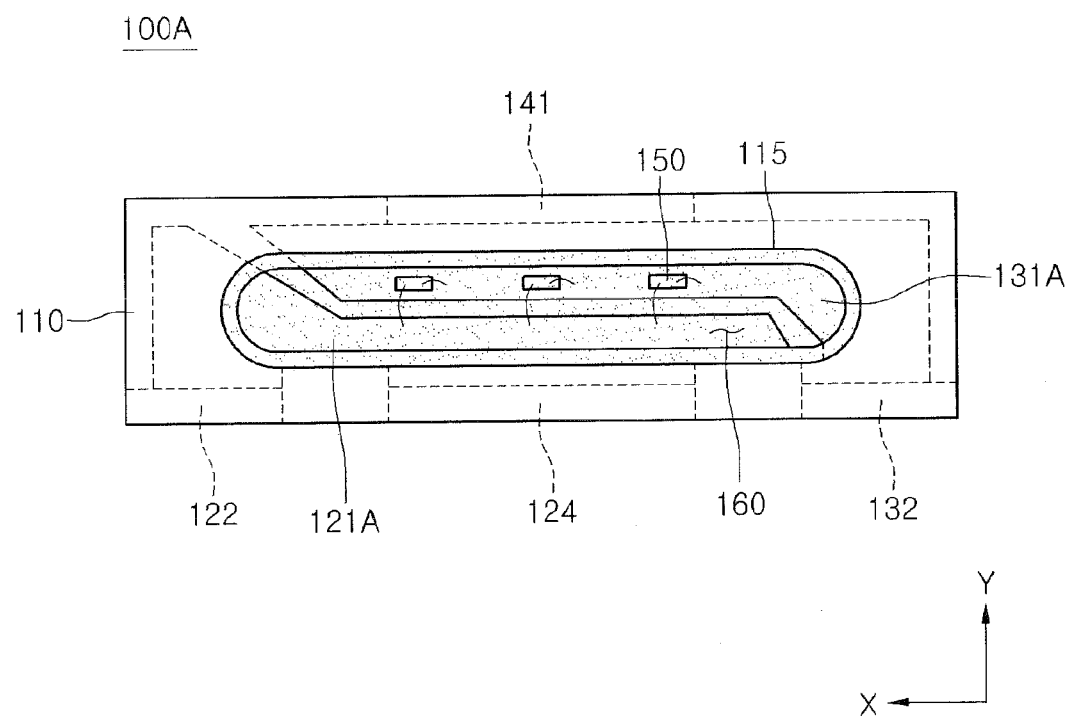
FIG. 8 is a front view showing a light emitting device package according to a second embodiment.

FIG. 8 is a front view showing a light emitting device package according to the second embodiment, and particularly, a schematic view showing the lead frame. Hereinafter, the second embodiment will be described while focusing on the different from the first embodiment.

Referring to FIG. 8, in a light emitting device package 100A, first and second lead frames 121A and 131A are disposed in the cavity 115, and a plurality of light emitting devices 150 are disposed in at least one of the first and second lead frames 121A and 131A. The first and second lead frames 121A and 131A extend in a longitudinal direction (an X axis) of the package in the cavity 115 and face each other in the cavity 115.

A plurality of light emitting devices 150 may be connected to each other in parallel or in series, and may include LED chips having the same color or different colors, but the embodiment is not limited thereto.

The first lead frame 121A includes the heat radiation pad 124 and the first electrode pad 122 extending in a direction of the second side surface of the body 110, and the second lead frame 131A includes a second electrode pad 132 extending in the direction of the second side surface of the body 110.

The heat radiation frame 141 is disposed at the third side surface of the body 110, and disposed in opposition to the heat radiation pad 124, thereby dissipating heat generated from the body 110.

Figure 9:
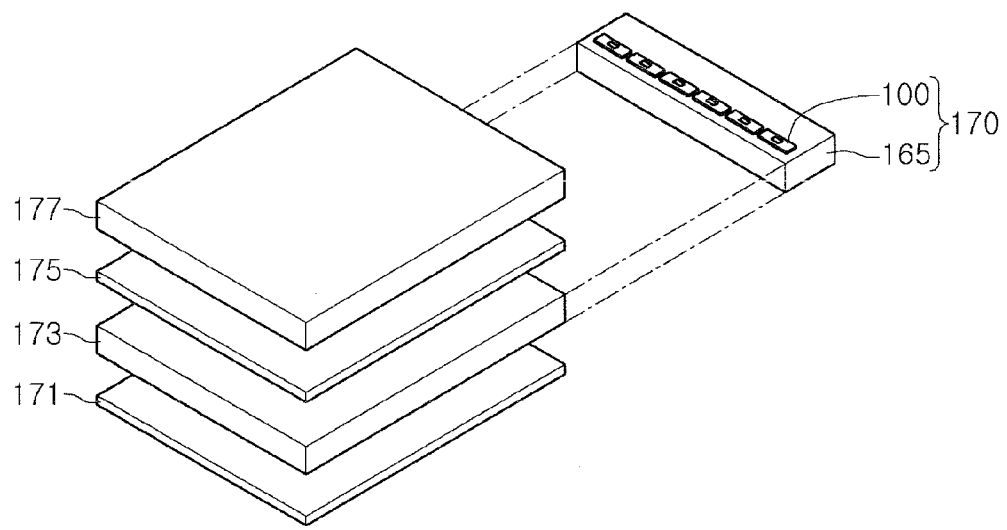
FIG. 9 is a view showing a display device according to a third embodiment.
Figure 10:
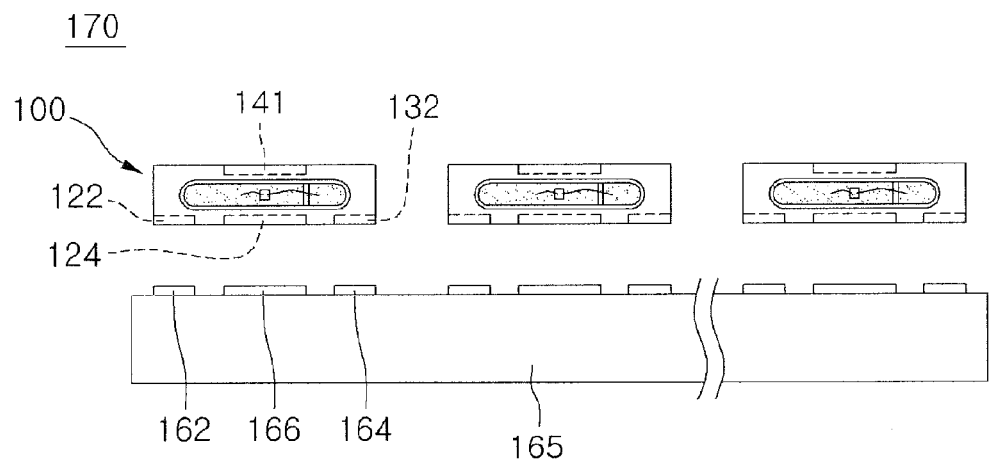
FIG. 10 is a view showing a light emitting module according to a third embodiment.

FIG. 9 is an exploded perspective view showing a display device according to the third embodiment, and FIG. 10 is an exploded view showing a light emitting module of FIG. 9.

Referring to FIGS. 9 and 10, a display device 200 includes a light emitting module 170 having a board 165, on which a plurality of light emitting device packages 100 are arrayed, a reflective plate 171, a light guide plate 173, an optical sheet 175, and a display panel 177. In this case, the light emitting module 170, the reflective plate 171, the light guide plate 173, and the optical sheet 175 may be defined as a light unit. The light unit may receive the components inside a cover such as a chassis or a mold frame thereof. The cover may include a bottom cover, and may include a metallic material.

The light emitting module 170 may be disposed corresponding to at least one side surface of the light guide plate 173. For example, the light emitting module 170 may be disposed at one side surface, both side surfaces, or two adjacent two side surfaces of the light guide plate 173, but the embodiment is not limited thereto.

The light emitting module 170 includes the board 165 on which a plurality of light emitting device packages 100 are arrayed, and the light emitting device packages 100 are soldered on the board 165. The board 165 is disposed thereon with the first and third patterns 162 and 164. The first pattern 162 serves as a first electrode pattern corresponding to the first electrode pad 122, and the second pattern 166 serves as a heat radiation pattern corresponding to the heat radiation pad 124. The third pattern 164 may serve as the second electrode pattern corresponding to the second electrode pad 132.

The first electrode pad 122, the heat radiation pad 124, and the second electrode pad 132 disposed at the lower portion of the light emitting device package 110 are connected to the first, second and third patterns 162, 166 and 164 of the board 165, respectively. The connection can be performed through a soldering bonding scheme, but the embodiment is not limited thereto.

The light emitting device 150 of the light emitting device package 100 is driven, and most of heat emitted from the light emitting device 150 is dissipated through the heat radiation pad 124 and the heat radiation frame 141. The heat transferred from the heat radiation frame 141 may be dissipated through the second pattern 166 of the board 165. In addition, the heat transferred to the heat radiation pad 124 may be dissipated through air or a metallic plate in the contact with the heat radiation pad 124.

The heat radiation frame 141 disposed on the light emitting device packages 100 may directly dissipate heat or may dissipate heat through a chassis which is a metallic material such as a stainless material, but the embodiment is not limited thereto. In this case, the chassis may make contact with the heat radiation frame 141 of the light emitting device package 100. Through the contact of the chassis, the light emitting device can effectively dissipate heat.

A light guide plate 173 is disposed at one side of the light emitting module 170. A light incident part of the light guide plate 173 is disposed corresponding to the cavity of the light emitting device package 100, that is, a light exit surface of the light emitting device package 100.

The light guide plate 173 may include a PC material, or PMMA (poly methyl methacrylate), and a reflective pattern may be formed on a top surface and/or a lower surface of the light guide plate 173, but the embodiment is not limited thereto.

The light guide plate 173 guides light incident from the light emitting device package 110 to the whole region so that the light is irradiated as surface light. The reflective plate 171 is disposed under the light guide plate 173, and the optical sheet 175 and the display panel 177 are disposed above the light guide plate 173.

The reflective plate 171 reflects light leaking from the light guide plate 173 toward the display panel 177, and the optical sheet 175 irradiates light incident from the light guide plate 173 to the display panel 177 with the uniform brightness distribution.

In this case, the optical sheet 175 may include at least one of a diffusion sheet, horizontal and vertical prism sheets, and a brightness enhancement sheet. The diffusion sheet diffuses incident light. The horizontal and vertical prism sheets concentrate the incident light onto the display region. The brightness enhancement sheet reuses lost light to improve brightness. In this case, the optical sheets 175 may be arranged in the order of a diffusion sheet and a prism sheet, but the embodiment is not limited thereto.

The display panel 177 is disposed on the optical sheet 175. The display panel 177 includes an LCD panel, first and second substrates facing each other and including transparent material, and a liquid crystal layer disposed between the first and second substrates. A polarizing plate may be attached to one surface of the display panel 177, but the embodiment is not limited thereto. The display panel 177 displays information through light passing through the optical sheet 175.

The display device 200 is applicable to a cellular phone, a monitor of a laptop computer, and a television. In addition, the light emitting module including the board and the light emitting diode package may be used in a light unit such as a headlight of a vehicle, a street lamp, and an indication lamp.

Figure 11:
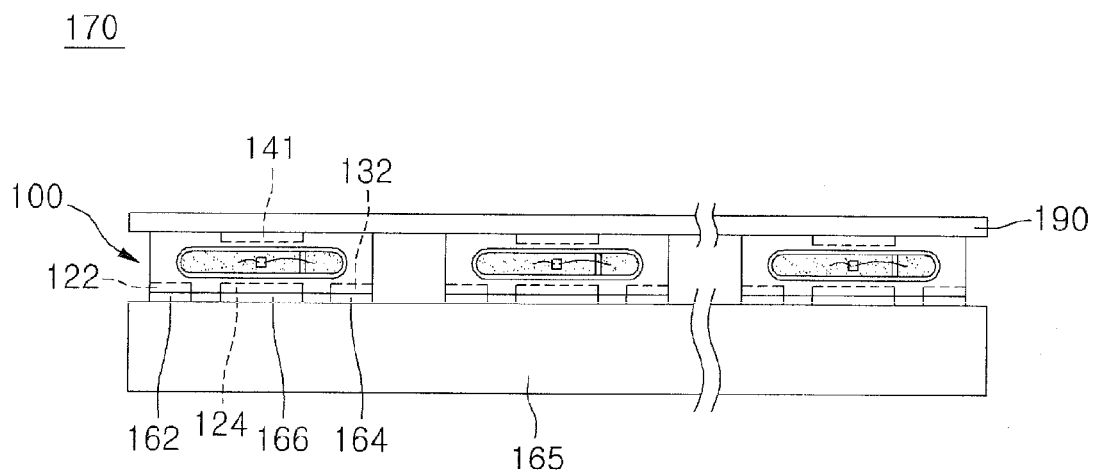
FIG. 11 is a view showing a light emitting module according to a fourth embodiment.

FIG. 11 is a front view showing a light emitting module according to the fourth embodiment.

Referring to FIG. 11, a heat sink plate 190 is disposed on a plurality of the light emitting diode packages 100. The heat sink plate 190 may include a metallic material or a stainless material having superior thermal conductivity. The heat sink plate 190 may make surface contact with the heat radiation frame 141 disposed on the top surface of the light emitting diode package 100. The heat sink plate 100 radiates heat transferred from the heat radiation pad 124 into the whole region, so that the heat radiation efficiency can be more improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a body including a cavity at a first surface;
   a first and second lead frames in the cavity;
   a light emitting device coupled to the first and second lead frames;
   a heat radiation pad coupled to a second surface of the body;
   a heat radiation frame coupled to a third surface of the body;
   a first electrode pad coupled to the second surface of the body; and
   a second electrode pad coupled to the second surface of the body,
   wherein the first electrode pad extends from the first lead frame, and the second electrode pad extends from the second lead frame,
   wherein the first electrode pad is spaced apart in a first direction from the heat radiation pad by a first interval, and the second electrode pad is spaced apart in the first direction from the heat radiation pad by a second interval, wherein the first electrode pad, the first interval, the heat radiation pad, the second interval and the second electrode pad are coplanar with each other,
   wherein the second surface of the body is disposed in opposing relation to the third surface of the body,
   wherein the heat radiation pad is disposed in the first direction between the first electrode pad and the second electrode pad,
   wherein the first electrode pad, the second electrode pad and the heat radiation pad are disposed at different regions on the second surface of the body,
   wherein the light emitting device is disposed on a top surface of the first lead frame, and the light emitting device is disposed in the cavity,
   wherein the body includes a reflective portion having the cavity and a support portion coupled to the reflective portion,
   wherein the first and second lead frames are disposed between the reflective portion and the support portion,
   wherein the support portion of the body includes a first region, a second region, and a third region between the first region and the second region,
   wherein the first electrode pad is disposed on the first region, and the second electrode pad is disposed on the second region,
   wherein the third region of the support portion of the body is disposed between the heat radiation pad and the heat radiation frame, and the third region of the support portion physically contacts the heat radiation pad and the heat radiation frame,
   wherein the heat radiation pad is vertically overlapped with the heat radiation frame, and
   wherein the heat radiation frame is electrically separated from the first and second lead frames, and the heat radiation frame is physically separated from the first and second lead frames.

2. The light emitting device package of claim 1, wherein the light emitting device is coupled to the first lead frame that has a longer length from the second lead frame.

3. The light emitting device package of claim 1, further comprising:
   at least one protrusion portion projecting from a portion of the heat radiation frame, wherein the at least one protrusion is inserted into the body,
   the at least one protrusion portion is vertically overlapped with the light emitting device, and
   wherein the body is disposed between the heat radiation frame and the first lead frame.

4. The light emitting device package of claim 1, wherein the body comprises:
   a first separation portion disposed between the heat radiation pad and the first electrode pad on the second surface of the body; and
   a second separation portion disposed between the heat radiation pad and the second electrode pad on the second surface of the body.

5. The light emitting device package of claim 1, wherein the heat radiation pad has an area greater than 40% of an area of the second surface of the body.

6. The light emitting device package of claim 1, wherein the heat radiation frame has an area smaller than an area of the heat radiation pad.

7. The light emitting device package of claim 1, wherein the heat radiation frame has an area at least two times greater than an area of one of the first and second electrode pads.

8. The light emitting device package of claim 1, wherein an interval between the first lead frame and the second lead frame disposed in the cavity is narrower than an interval between the heat radiation pad and the second electrode pad.

9. The light emitting device package of claim 1, further comprising a resin in the cavity.

10. The light emitting device package of claim 1, wherein:
    the first electrode pad is closer to the head radiation pad than to the second electrode pad, and
    a portion of the heat radiation frame coupled to the third surface of the body corresponds to the heat radiation pad coupled to the second surface of the body.

11. The light emitting device package of claim 1, wherein each of the first electrode pad and the heat radiation frame pass through different regions of the body from the first lead frame,
    wherein the second electrode pad passes through the body from the second lead frame.

12. The light emitting device package of claim 1, wherein the heat radiation frame does not pass through the body.

13. A light emitting device package comprising:
    a body having a cavity;
    a first lead frame and a second lead frame disposed in the cavity;

a light emitting device coupled to the first lead frame;
a heat radiation pad extending from the first lead frame, wherein the heat radiation pad is coupled to a lower surface of the body;
a heat radiation frame coupled to a top surface of the body;
a first electrode pad coupled to the lower surface of the body, wherein the first electrode pad is spaced away from the heat radiation pad in a first direction, and wherein the first electrode pad extends from the first lead frame;
a second electrode pad coupled to the lower surface of the body, wherein the second electrode pad is spaced away from the heat radiation pad in the first direction, and wherein the second electrode pad extends from the second lead frame; and
a resin in the cavity,
wherein the lower surface of the body is disposed in opposing relation to the top surface of the body, and
wherein the heat radiation pad is disposed in the first direction between the first electrode pad and the second electrode pad,
wherein the first electrode pad is spaced away from the heat radiation pad by a first interval in the first direction, the second electrode pad is spaced away from the heat radiation pad by a second interval in the first direction, wherein the first electrode pad, the first interval, the heat radiation pad, the second interval and the second electrode pad are coplanar with each other,
wherein the first electrode pad, the second electrode pad and the heat radiation pad are disposed at different regions on the second surface of the body,
wherein the light emitting device is disposed on a top surface of the first lead frame, and the light emitting device is disposed in the cavity,
wherein the body includes a reflective portion having the cavity and a support portion coupled to the reflective portion,
wherein the first and second lead frames are disposed between the reflective portion and the support portion,
wherein the support portion of the body includes a first region, a second region, and a third region between the first region and the second region,
wherein the first electrode pad is disposed on the first region, and the second electrode pad is disposed on the second region,
wherein the third region of the support portion of the body is disposed between the heat radiation pad and the heat radiation frame, and the third region of the support portion physically contacts the heat radiation pad and the heat radiation frame,
wherein the heat radiation pad is vertically overlapped with the heat radiation frame, and
wherein the heat radiation frame is electrically separated from the first and second lead frames, and the heat radiation frame is physically separated from the first and second lead frames.

14. The light emitting device package of claim 13, further comprising
a recess portion coupled to the top surface of the body,
wherein a bottom surface of the recess portion is closer to the lower surface of the body than to the top surface of the body, and the heat radiation frame is disposed in the recess portion.

15. The light emitting device package of claim 13, further comprising
a plurality of recess portions coupled to the lower surface of the body,
wherein a bottom surface of the recess portions are closer to the top surface of the body than to the lower surface of the body, and the first electrode pad, the heat radiation pad, and the second electrode pad are disposed in respective ones of the recess portions.

16. A light unit comprising:
a board including first to third patterns; and
a plurality of light emitting device packages coupled to the board,
wherein each light emitting device package comprises:
a body including a cavity at a first surface;
a first lead frame and a second lead frame in the cavity;
a light emitting device coupled to the first lead frame and to the second lead frame;
a heat radiation pad coupled to a second surface of the body and coupled to the second pattern of the board;
a heat radiation frame coupled to a third surface of the body;
a first electrode pad coupled to the second surface of the body; and
a second electrode pad coupled to the second surface of the body, and
wherein the first and second electrode pads are coupled to the first and third patterns of the board,
wherein the second surface of the body is disposed in opposing relation to the third surface of the body,
wherein the heat radiation pad is disposed in a first direction between the first electrode pad and the second electrode pad,
wherein the first to third patterns are disposed on a top surface of the board,
wherein the first electrode pad is separated away from the heat radiation pad by a first interval in the first direction, and the second electrode pad is separated away from the heat radiation pad by a second interval in the first direction, wherein the first electrode pad, the first interval, the heat radiation pad, the second interval and the second electrode pad are coplanar with each other,
wherein the first electrode pad, the second electrode pad and the heat radiation pad are disposed at different regions on the second surface of the body,
wherein the light emitting device is disposed on a top surface of the first lead frame, and the light emitting device is disposed in the cavity,
wherein the body includes a reflective portion having the cavity and a support portion coupled to the reflective portion,
wherein the first and second lead frames are disposed between the reflective portion and the support portion,
wherein the support portion of the body includes a first region, a second region, and a third region between the first region and the second region,
wherein the first electrode pad is disposed on the first region, and the second electrode pad is disposed on the second region,
wherein the third region of the support portion of the body is disposed between the heat radiation pad and the heat radiation frame, and the third region physically contacts the heat radiation pad and the heat radiation frame,
wherein the heat radiation pad is vertically overlapped with the heat radiation frame, and
wherein the heat radiation frame is electrically separated from the first and second lead frames, and the heat radiation frame is physically separated from the first and second lead frames.

17. The light unit of claim 16, wherein the heat radiation pad and the first electrode pad extend from the first lead frame and the second electrode pad extends from the second lead frame.

18. The light unit of claim 16, further comprising
a heat radiation plate coupled to the light emitting device packages and wherein the heat radiation plate is in contact with the heat radiation frame of each of the light emitting device packages.

19. The light unit of claim 18, wherein the light emitting device is coupled to the first lead frame, and the heat radiation frame, the heat radiation pad, and the light emitting device are arranged substantially in line with each other.

20. The light unit of claim 16, further comprising
a light guide plate corresponding to the first surface of the light emitting device packages.

* * * * *